United States Patent
Krajewski et al.

(10) Patent No.: US 7,829,783 B2
(45) Date of Patent: Nov. 9, 2010

(54) ISOLATED METALLIC FLEXIBLE BACK SHEET FOR SOLAR MODULE ENCAPSULATION

(75) Inventors: Todd Krajewski, Mountain View, CA (US); Jason Corneille, San Jose, CA (US); Shefali Jaiswal, Milpitas, CA (US)

(73) Assignee: Miasole, Santa Clara, CA (US)

( * ) Notice: Subject to any disclaimer, the term of this patent is extended or adjusted under 35 U.S.C. 154(b) by 0 days.

(21) Appl. No.: 12/464,721

(22) Filed: May 12, 2009

(65) Prior Publication Data

US 2010/0071756 A1    Mar. 25, 2010

(51) Int. Cl.
*H01L 31/048* (2006.01)
(52) U.S. Cl. .................................................. 136/251
(58) Field of Classification Search ........... 257/790; 136/243–265
See application file for complete search history.

(56) References Cited

U.S. PATENT DOCUMENTS

| | | | |
|---|---|---|---|
| 4,046,951 A * | 9/1977 | Stefanik | 428/412 |
| 4,233,085 A * | 11/1980 | Roderick et al. | 136/244 |
| 4,457,578 A | 7/1984 | Taylor | |
| 4,692,557 A | 9/1987 | Samuelson et al. | |
| 5,008,062 A | 4/1991 | Anderson et al. | |
| 5,597,422 A | 1/1997 | Kataoka et al. | |
| 5,741,370 A | 4/1998 | Hanoka | |
| 6,034,323 A | 3/2000 | Yamada et al. | |
| 6,128,868 A | 10/2000 | Ohtsuka et al. | |
| 6,660,930 B1 | 12/2003 | Gonsiorawsk | |
| 6,953,599 B2 | 10/2005 | Shiotsuka et al. | |
| 6,967,115 B1 | 11/2005 | Sheats | |
| 2002/0129848 A1 | 9/2002 | Miura et al. | |
| 2003/0079772 A1 | 5/2003 | Gittings et al. | |
| 2005/0115603 A1 | 6/2005 | Yoshida et al. | |
| 2005/0257826 A1 | 11/2005 | Yamanaka et al. | |
| 2006/0042681 A1 | 3/2006 | Korman | |
| 2007/0144576 A1 * | 6/2007 | Crabtree et al. | 136/251 |
| 2007/0295388 A1 | 12/2007 | Adriani et al. | |
| 2008/0017241 A1 | 1/2008 | Anderson et al. | |

(Continued)

FOREIGN PATENT DOCUMENTS

WO    9206144 A1    4/1992

(Continued)

OTHER PUBLICATIONS

B.P.F. Day, Campden and Chorleywood Food Research Association, "Chilled Food Packaging" in Chilled Foods: A Comprehensive Guide, 2nd Edition, pp. 135-150.*

(Continued)

*Primary Examiner*—Jennifer K Michener
*Assistant Examiner*—Magali P Slawski
(74) *Attorney, Agent, or Firm*—Weaver Austin Villeneuve & Sampson LLP (57) ABSTRACT

Provided are novel back sheets for solar module encapsulation. According to various embodiments, the back sheets are ungrounded and flexible. In certain embodiments, the back sheets include an integrated flexible and electrically isolated moisture barrier and a seal around the edge of the moisture barrier. The electrically isolated moisture barrier may be a thin metallic sheet, e.g., an aluminum foil. The electrically isolated, flexible moisture barrier eliminates the need for grounding.

20 Claims, 5 Drawing Sheets

U.S. PATENT DOCUMENTS

| | | | |
|---|---|---|---|
| 2008/0041442 | A1 | 2/2008 | Hanoka |
| 2008/0053512 | A1* | 3/2008 | Kawashima ............... 136/244 |
| 2008/0128018 | A1 | 6/2008 | Hayes |
| 2008/0185035 | A1 | 8/2008 | Hayes |
| 2008/0190481 | A1 | 8/2008 | Hayes et al. |
| 2008/0196760 | A1 | 8/2008 | Hayes et al. |
| 2008/0210287 | A1 | 9/2008 | Volpp et al. |
| 2008/0264471 | A1 | 10/2008 | Hayes |
| 2008/0289681 | A1 | 11/2008 | Adriani et al. |
| 2008/0289682 | A1 | 11/2008 | Adriani et al. |
| 2008/0302418 | A1* | 12/2008 | Buller et al. ............... 136/259 |
| 2009/0114261 | A1 | 5/2009 | Stancel et al. |

FOREIGN PATENT DOCUMENTS

| | | | |
|---|---|---|---|
| WO | 2006106844 | A1 | 10/2006 |
| WO | 2008136872 | A1 | 11/2008 |

OTHER PUBLICATIONS

U.S. Appl. No. 12/556,460, "Isolated Metallic Flexible Back Sheet for Solar Module Encapsulation", Krajewski et al., filed Sep. 9, 2009.

U.S. Appl. No. 12/639,346, "Oriented Reinforcement for Frameless Solar Modules", Krajewski et al., filed Dec. 16, 2009.

Nowlan, M. J., "Hermetic Edge Sealing of Photovoltaic Modules," National Aeronautics and Space Administration, Washington D.C., Report: NAS 1.26.173125; DOE/JPL-956352/2, Jul. 1983, 29 page.

National Aeronautics and Space Administration, "Hermetic Edge Seals for Photovoltaic Modules," Washington D.C., Aug. 1986, 1 page.

Nowland, M.J., et al, "Process Automation for Photovoltaic Module Assembly and Testing," Photovoltaic Specialists Conference, 2000, Conference Record of the Twenty-Eight IEEE, Sep. 15-22, 2000, 4 page.

Hanoka, J. I., et al., "Low Cost Module and Mounting Systems Developed Through Evergreen Solar's PVMaT Program", Photovoltaic Specialists Conference, 1997, Conference Record of Twenty-Sixth IEEE, Sep. 29-Oct. 3, 1997, 4 page.

US Office Action for U.S. Appl. No. 12/556,450, mailed Apr. 5, 2010.

Wiles, John, "Photovoltaic Systems and the 2005 National Electrical Code: Suggested Practices," Southwest Technology Development Institute, New Mexico State University, pp. 1-149, 2008.

MIL-STD-275E, Military Standard, Printed Wiring for Electronic Equipment, 1984.

MIL-S-83576, Military Specification, Solar Dell Arrays, Space Vehicle, Design and testing, General Specification for, 1974.

Office Action mailed Sep. 14, 2010, for U.S. Appl. No. 12/556,460.

* cited by examiner

ISOLATED METALLIC FLEXIBLE BACK SHEET FOR SOLAR MODULE ENCAPSULATION

BACKGROUND OF THE INVENTION

Photovoltaic cells are widely used for generation of electricity, with multiple photovoltaic cells interconnected in module assemblies. Such modules may in turn be arranged in arrays and integrated into building structures or otherwise assembled to convert solar energy into electricity by the photovoltaic effect. Individual modules are encapsulated to protect the module components from the environment. A module may be framed, with the frame configured for attachment to a support surface. Framing and encapsulating materials can contribute significantly to the weight and cost of a module.

SUMMARY OF THE INVENTION

Provided are novel back sheets for solar module encapsulation. According to various embodiments, the back sheets are ungrounded and flexible. In certain embodiments, the back sheets include an integrated flexible and electrically isolated moisture barrier and a seal around the edge of the moisture barrier. The electrically isolated moisture barrier may be a thin metallic sheet, e.g., an aluminum foil. The electrically isolated, flexible moisture barrier eliminates the need for grounding.

One aspect of the invention relates to solar modules that include a transparent front layer, a multi-layer flexible back sheet; and a plurality of interconnected photovoltaic cells disposed between the transparent front layer and the multi-layer flexible back sheet. The multi-layer flexible back sheet includes an insulation sheet, an electrically isolated moisture barrier, a back layer and a seal; with the insulation sheet disposed between the plurality of photovoltaic cells and the moisture barrier and the moisture barrier disposed between the insulation sheet and the back layer. The seal includes a bond between the insulation sheet and the back layer and extends around the moisture barrier such that the insulation sheet, back layer and seal electrically isolate the moisture barrier.

Another aspect of the invention relates to solar modules including a transparent front layer, an ungrounded moisture barrier flexible back sheet, and a plurality of interconnected photovoltaic cells located between the transparent front layer and the ungrounded moisture barrier flexible back sheet, wherein the ungrounded moisture barrier flexible back sheet has a water vapor transmission rate (WVTR) of no more than about $10^{-2}$ g/m$^2$/day. In certain embodiments, the WVTR is no more than about $10^{-3}$ g/m$^2$/day.

The transparent front layer may be a rigid material, e.g., a glass plate, or it may be flexible material. The photovoltaic cells may be any type of photovoltaic cells, including but not limited to CIS, CIGS, CdTe or silicon photovoltaic cells.

According to various embodiments, the moisture barrier is a pinhole free conductive material, e.g., pinhole free aluminum foil. The moisture barrier is typically thin, e.g., no more than about 50 microns thick, or no more than 25 microns thick. Other thicknesses may be used as appropriate to provide a flexible moisture barrier.

According to various embodiments, the insulation sheet is a dielectric material capable of withstanding at least a certain potential, e.g., a 600 V potential or 1000 V potential. In certain embodiments, a PET insulation sheet having a thickness of about 1-10 mils is used. The insulation sheet may be a single sheet or a multi-layer sheet, e.g., with different layers having different material properties or compositions.

The back layer may be a weatherable material capable of protecting the module from external conditions, for example polyvinyl fluoride or other fluoropolymers. In alternative embodiments, the back layer may be another material, and the module may include a weatherable material under the back layer. The back layer may be a single layer or may have multiple layers, e.g., with different layers having different material properties or compositions. The bond between the insulation sheet and back layer may be an adhesive bond, or any other type of bond sufficient to electrically isolate the edge of the moisture barrier.

In certain embodiments, the insulation sheet and/or back layer and the moisture barrier have substantially coextensive end portions along a first direction. For example, in a roll-to-roll process, a module-sized stack, including a moisture barrier as well as insulation sheet and/or back layer may be cut from a web, with the moisture barrier coextensive with the insulation sheet and/or back layer at the cut edges. A coextensive insulation sheet end portion and a moisture barrier end portion may be folded to together form an inwardly curved end portion, with the moisture barrier end portion on the interior of said inwardly curved end portion. In this manner, the edges of moisture barrier are electrically isolated from the rest of the module. In certain embodiments, the seal may include a folded over portion as described.

In certain embodiments, the seal extends at least about 1-2 mm past at least two edges or on all edges of the moisture barrier. In certain embodiments, the width of the seal on at least two edges or on all edges of the moisture barrier is at least about 1-2 mm. In certain embodiments, an edge seal material containing a moisture getter or desiccant material such as a butyl based material, surrounds the photovoltaic cells. The outer perimeter of the moisture barrier may be in between the inner and outer perimeters of the seal material in certain embodiments.

Also provided are flexible multi-layer back sheets and methods of fabricating the same, as well as pre- and post-laminate back sheet and solar module stack assemblies. These and other aspects of the invention are described further below with reference to the figures.

DETAILED DESCRIPTION

Reference will now be made in detail to specific embodiments of the invention. Examples of the specific embodiments are illustrated in the accompanying drawings. While the invention will be described in conjunction with these specific embodiments, it will, be understood that it is not intended to limit the invention to such specific embodiments. On the contrary, it is intended to cover alternatives, modifications, and equivalents as may be included within the spirit and scope of the invention. In the following description, numerous specific details are set forth in order to provide a thorough understanding of the present invention. The present invention may be practiced without some or all of these specific details. In other instances, well known mechanical apparatuses and/or process operations have not been described in detail in order not to unnecessarily obscure the present invention.

Figure 1:
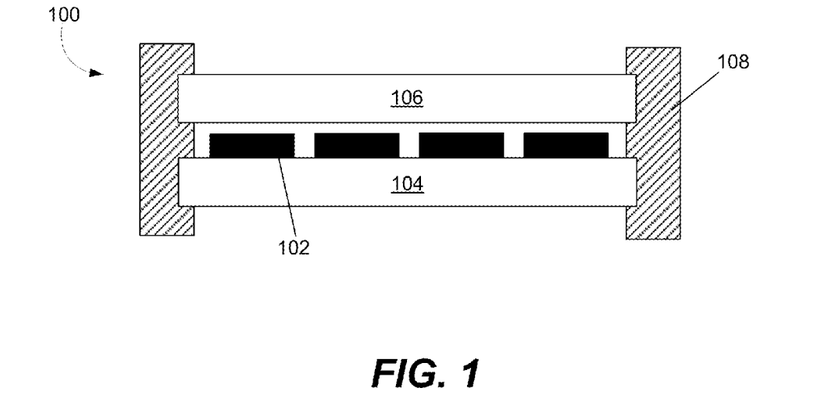
FIG. 1 shows a cross-sectional view of certain components of a solar module.

Embodiments of the present invention relate to encapsulating solar modules for environmental protection and mechanical support. FIG. 1 shows a cross-sectional view of certain components of a solar module 100, including interconnected solar cells 102 and front and back encapsulating layers 104 and 106, respectively. Front and back encapsulating layers 104 and 106 protect interconnected solar cells 102 and other module components from environmental conditions. In certain modules, a frame 108 surrounds the rest of the module for mechanical support.

Front and back encapsulating layers 104 and 106 can contribute significantly to the weight and transportation costs of a module, Rigid materials such as glass sheets, for example, provide good protection against environmental conditions but can add on the order of $2/sheet in transportation costs. While flexible materials such as aluminum foil are lighter and cheaper than glass, they present their own costs and issues. In particular, conventional metalized back sheets require grounding the metal in the back sheet or a grounded metal frame surrounding the module to prevent electrical shorting. Grounding a module, e.g., via a conductive frame also presents a major cost: the frame, conductors to ground, and installation costs of a grounded module are significant and present barriers to the competitive pricing of solar energy generation.

Provided herein are flexible encapsulating materials that do not require grounding or framing. The materials are considerably lighter and easier to handle than rigid encapsulation materials, and do not require the attendant issues of grounding and framing that conventional metalized encapsulation layers do. In certain embodiments, a flexible metallic back sheet is provided. Unlike current metalized back sheets for moisture impermeable solar module encapsulation, the metalized back sheets described herein do not require grounding to meet UL standards, and may be ungrounded in certain embodiments. Section 690.43 of the 2005 National Electrical Code (NEC) requires that: "Exposed non-current-carrying metal parts of module frames, equipment, and conductor enclosures shall be grounded in accordance with 250.134 or 250.136(A) regardless of voltage." Because embodiments of the invention do not have exposed moisture barriers, or in certain embodiments, any exposed metal parts, they do not require grounding to be in compliance with the 2005 version of the US NEC. In particular embodiments, the solar modules or back sheets described herein meet the wet leakage current and/or high potential standards as defined in UL 1703. Article 690 of the 2005 NEC and UL 1703, edition 3, as revised April 2008, are incorporated by reference herein.

Figure 2:
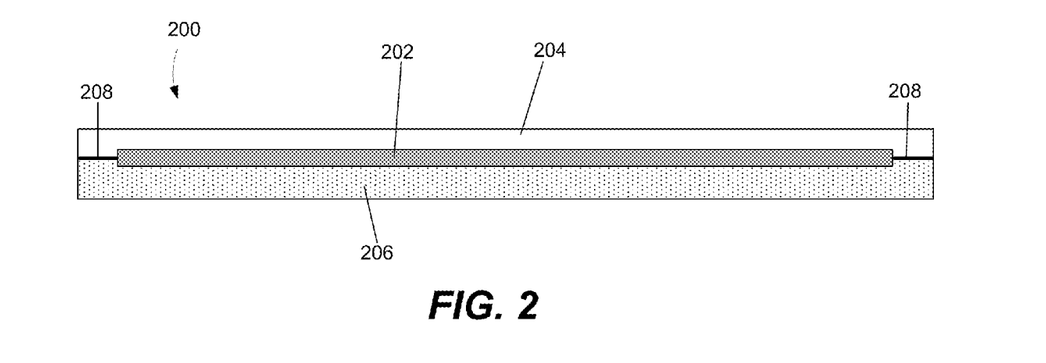
FIG. 2 is a cross-sectional view of a flexible back sheet according to certain embodiments.

FIG. 2 is a cross-sectional view of a flexible back sheet 200 according to certain embodiments. Back sheet includes a flexible moisture barrier 202 sandwiched between an insulation sheet 204 and a back layer 206. A seal 208 extends around the moisture barrier. Insulation sheet 204, back layer 206 and seal 208 together electrically isolate the moisture barrier 202 to prevent shorting between the solar cells in the assembled module and the moisture barrier 202.

Moisture barrier 202 may be any material that is flexible and moisture impermeable. Moisture impermeability may be defined by the water vapor transmission rate (WVTR), the steady state rate at which water vapor permeates through a film at specified conditions of temperature and relative humidity. According to various embodiments, the moisture barrier has a WVTR of no more than $10^{-2}$ g/m$^2$/day at 38° C. and 100% relative humidity. In certain embodiments, the moisture barrier has a WVTR of no more than $10^{-3}$ g/m$^2$/day at 38° C. and 100% relative humidity.

The moisture barrier may be a pinhole-free metallic material, including, but not limited to pinhole-free aluminum foil. In addition to aluminum or alloys thereof, metallic moisture barriers may be copper, palladium, titanium, gold, silver, iron, molybdenum, stainless steel, steel, zinc, alloys thereof such as brass, or other combinations thereof. In certain embodiments, the moisture barrier may be a metallic or other conductive material in combination with another material. The moisture barrier should be thick enough to be pinhole-free, or to meet the desired WVTR. This varies according to the particular metal used. In one example, aluminum foil as thin as about 17 microns is used. In another example, pinhole-free aluminum foil as thin as about 25 microns, or about 50 microns is used. In certain embodiments, moisture barriers between about 5 and 500 microns may be used, though other thicknesses may be used as well.

In certain embodiments, insulation sheet 204 is sufficient to withstand a high electrical potential between a conductive moisture barrier 202 and the solar cells (not shown) to prevent arcing or shorting. The voltage withstand of the sheet is a function of the material properties of the insulation sheet material as well as the thickness of the sheet. In certain examples, thickness ranges from about 1 to 10 mils or higher, though other thicknesses may be used as appropriate. According to various embodiments, the voltage withstand of the insulation sheet is at least about 500 V, at least about 600 V, at least about 700 V, at least about 800 V, at least about 900 V, at least about 1000 V, at least about 1500 V, or at least about 2000 V. In certain embodiments, the insulation material is or contains a thermoplastic material. Non-limiting examples of insulation materials include thermal polymer olefins (TPO) and non-olefin thermoplastic polymers, including polyethylene, polypropylene, polybutylene, polyethylene terephthalate (PET), polybutylene terephthalate (PBT), polystyrene, polycarbonates, ethylene-vinyl acetate (EVA), fluoropolymers, acrylics, including poly(methyl methacrylate), or silicones, as well as multilayer laminates and co-extrusions, such as PET/EVA laminates or co-extrusions. In one example, the insulation sheet is PET. In other examples, the insulation sheet is a nylon, acylonitrile butadiene styrene ABS), polybutylene terephtalate (PBT), (polycarbonate (PC), PPS (polyphenylene sulfide (PPS), or polyphenylene oxide (PPO). Other suitable electrically insulating materials may be used, e.g., thin ceramic materials. Filled materials may also be used.

Back layer 206 may be a weatherable material that protects the cells and other module components from moisture, UV exposure, extreme temperatures, etc. The back layer may be a fluoropolymer, including but not limited to polyvinyl fluoride (PVF), polyvinylidene fluoride (PVDF), ethylene-terafluoethylene (ETFE), fluorinated ethylene-propylene (FEP), perfluoroalkoxy (PFA) and polychlorotrifluoroethane (PCTFE). Other weatherable materials may be used in addition to or instead of a fluoropolymer, including silicone polyesters, chlorine-containing materials such as polyvinyl chloride (PVC), plastisols and acrylics. In certain embodiments, any material that meets UL 1703 requirements (incorporated by reference above) is used. In one example, the back layer is PVF. In certain examples, thickness range from about 1 to about 4 mils, although other thicknesses may be used as appropriate.

Seal 208 includes a bond between back layer 208 and insulation sheet 204 and is effective to prevent any electrical contact between the moisture barrier and the solar cells or any other component of the module at the edge of moisture barrier 202. It is typically a permanent or irreversible seal and prevents peeling at the edges that would expose the edge of moisture barrier 202. According to various embodiments, the seal is at least 0.5 mm, 1 mm or 2 mm wide and extends around the edge of the moisture barrier. The bond between back layer 208 and insulation sheet 204 may be an adhesive bonding, a fusion bonding, a welding, a solder bond, or a mechanical fastening. As used herein, the term "permanent seal" refers to a seal that has a resistance to rupture greater than a frangible seal. As used herein, "irreversible seal" refers to seal that is unbreakable by exposure to atmospheric heat and weather conditions, and generally must be deliberately tampered with to be broken. In certain embodiments, the seal includes covalent bonding, e.g., between an adhesive and the back layer and/or insulation sheet, or between the insulation sheet and back layer, etc.

If an adhesive material is used, it may be a thermoplastic adhesive, a liquid adhesive, a curable adhesive, or any other type of adhesive that creates an irreversible seal, is resistant to peeling and has good moisture resistance. Thermoplastic adhesives that may be used include acrylics, silicone resins, polyamines and polyurethanes. In certain embodiments, the adhesive may also be used to adhere the insulation sheet and back layer to the moisture barrier. In certain embodiments, one of the layers may be formed by extrusion coating or casting, e.g., on a chemically primed surface. For example, moisture barrier 202 may be adhered to insulation sheet 204. Insulation sheet 204 or (insulation sheet 204 and moisture barrier 202) may then be chemically primed and back layer 206 formed by extrusion coating or casting onto the chemically primed surface.

Figure 3:
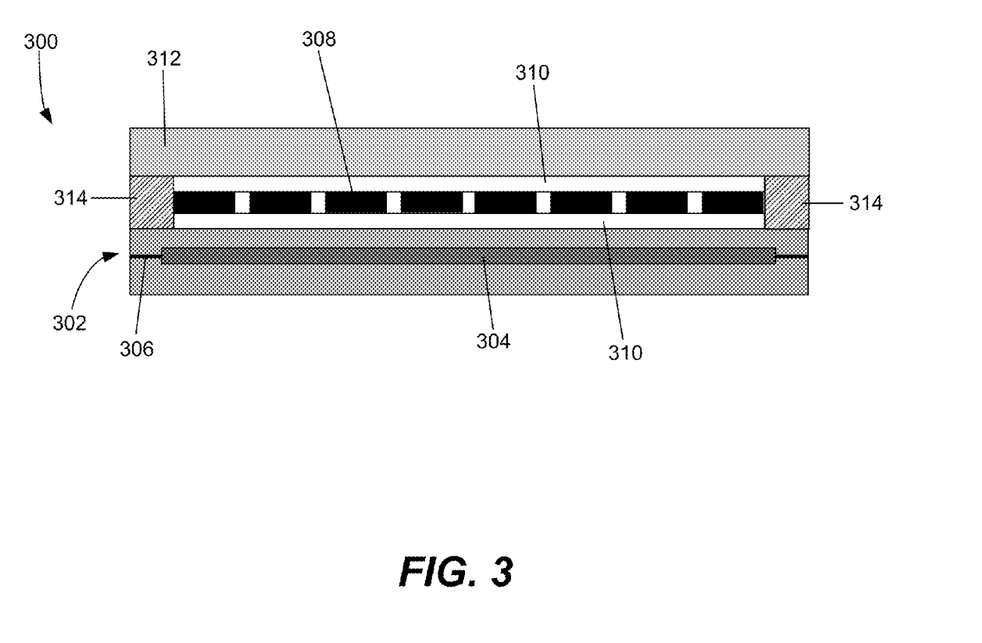
FIG. 3 is a cross-sectional view of a solar module having a metalized back sheet according to certain embodiments.

FIG. 3 shows an example of solar module 300 having a metalized back sheet 302 as described above. For the purposes of illustration, the schematic is not drawn to scale. Solar cells 308 may be any type of solar cells, including but not limited to, semiconductor-based solar cells including microcrystalline or amorphous silicon, cadmium telluride, copper indium gallium selenide or copper indium selenide, dye-sensitized solar cells, and organic polymer solar cells.

Solar cells 308 are encapsulated by layers 310, which may be a thermoplastic material, e.g., an acrylic or silicone material, that protects the solar cells. A material 314 surrounds solar cells 308, and in this example, is embedded within encapsulating layers 310. The material 314 may be an organic or inorganic material that has a low inherent WVTR (typically less than 1-2 g/m$^2$/day) and, in certain embodiments may absorb moisture, prevents its incursion through and along edges of layers 310. In one example, a butyl-rubber containing moisture getter or desiccant is used. The encapsulated cells 308 are protected by a transparent front layer 312 and back sheet 302, including the moisture barrier 304 and seal 306.

Figure 4:
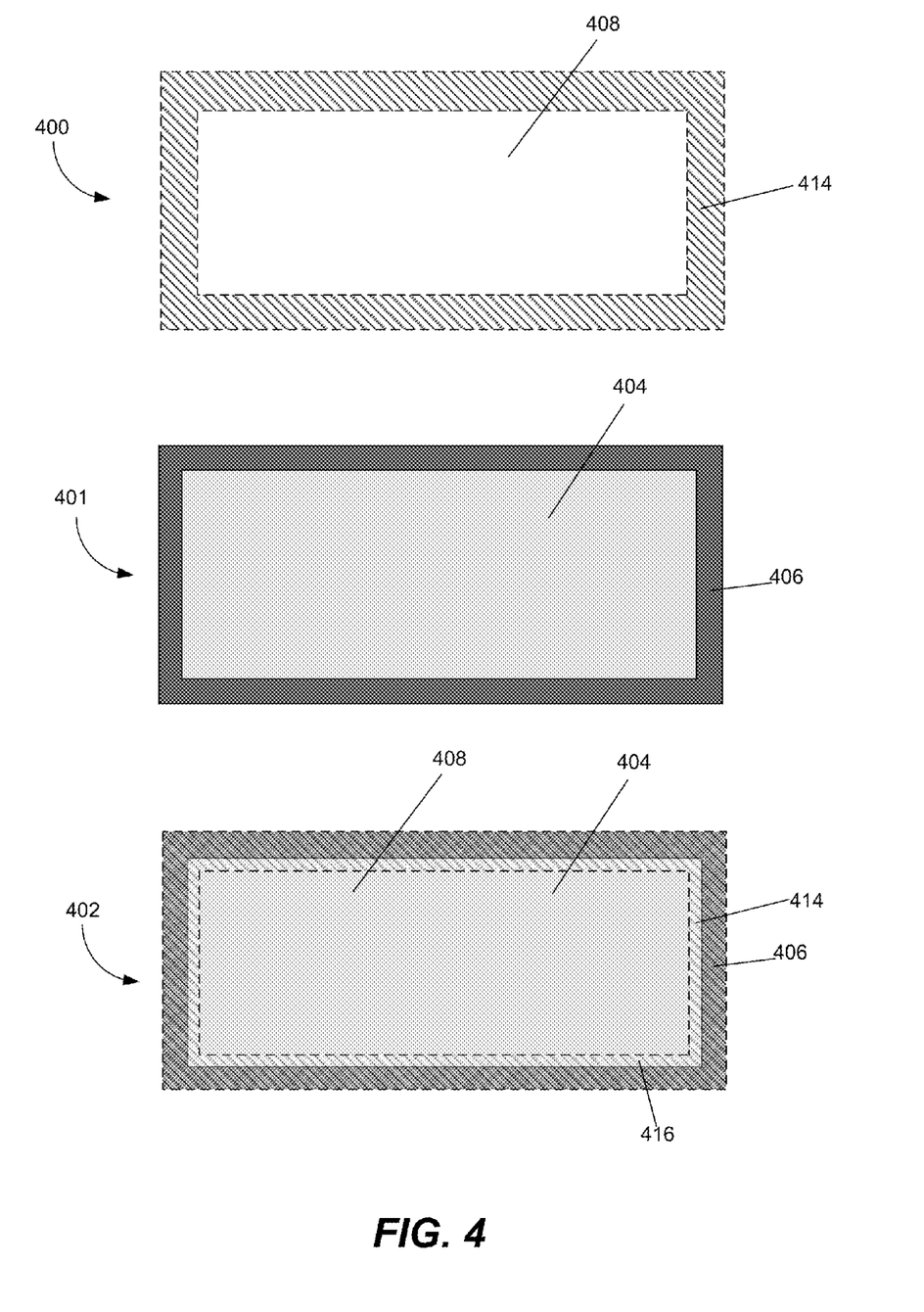
FIG. 4 depicts 1) a top view according to certain embodiments of a solar cell area of a solar module and moisture getter/desiccant material surrounding the solar cell area, 2) a top view according to certain embodiments of a metallic moisture barrier of a solar module and a seal surrounding the metallic moisture barrier, and 3) a top view of a solar cell area and surrounding moisture getter overlying a metallic moisture barrier and seal, also according to certain embodiments.

In the figure, moisture barrier material 304 is disposed under solar cells 308, but extends at least a small distance past solar cells 308, such that it partially underlies material 314. In certain embodiments, the outer perimeter of the moisture barrier 304 is located between the inner and outer perimeters of the material 314. An example of such an embodiment is depicted in FIG. 4, which shows a top view 400 of solar cell area 408 and material 414 surrounding solar cell area 408. Also shown is a top view 401 of a metallic moisture barrier 404 and seal 406 surrounding metallic moisture barrier 406, (For the purpose of illustration, other layers, such as an insulation sheet and encapsulation layers are not depicted.) Top view 402 shows the solar cell area 408 and material 414 overlying metallic moisture barrier 404 and seal 406. Material 414 and metallic moisture barrier 404 overlap in region 416. This provides moisture protection over the entire solar cell area 408. At the same time, seal 406 prevents electrical contact with the edges of the moisture barrier 406.

Conventional back sheets that incorporate a metallic sheet, such as Tedlar®/Al foil/PET back sheets, require grounding the aluminum foil in the back sheet or a grounded metal frame surrounding the module to meet UL and other safety requirements. This is due to the exposure or possible exposure of the aluminum foil at the cut edge. According to various embodiments, the moisture barriers described herein are ungrounded. The overlying and underlying polymers layers (e.g., PET insulation sheet and PVF weatherable back layer) together with the seal surrounding the moisture barrier electrically isolate the moisture barrier, obviating the need to ground the moisture barrier. Because the electrically isolated moisture barriers described herein do not need to be grounded, mechanical support considerations are decoupled from electrical considerations. Thus, according to various embodiments, the solar cell modules described herein included frameless as well as framed modules. In certain embodiments, the unframed modules may be configured to be attached an array frame or other support structure at an installation site.

Figure 5:
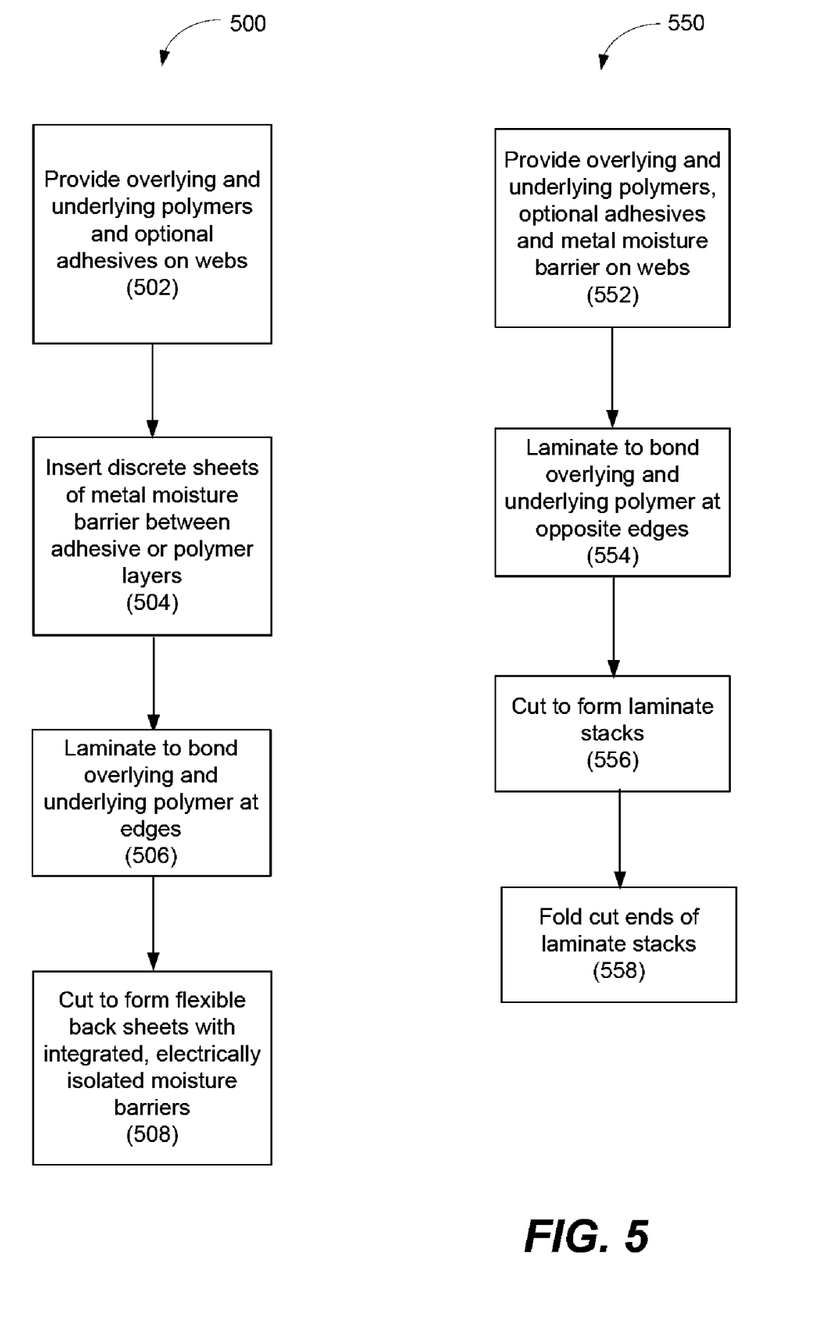
FIG. 5 depicts certain operations in roll-to-roll processes of forming multi-layer back sheets according to various embodiments.

Also provided are processes of fabricating the multi-layer back sheets described herein. FIG. 5 depicts operations in roll-to-roll processes of forming the multi-layer back sheets according to various embodiments. In process 500, discrete sheets of metal foil, typically having dimensions less than the underlying back layer and overlying insulation sheet are inserted into a pre-laminate stack including a polymeric insulation sheet and back layer material. The process begins at an operation 502, in which insulation sheet and back layer polymers and, if used, thermoplastic adhesives are provided on webs. For example, webs of PET, adhesive and PVF may be provided to assemble a PET/adhesive/adhesive/PVF pre-laminate stack. In an operation 504, discrete sheets of a metallic moisture barrier are inserted between the polymer sheets. For example, a sheet of aluminum foil is inserted between adhesive sheets to form a PET/adhesive/Al foil/adhesive/PVF pre-laminate stack assembly. The aluminum foil or other moisture barrier may be inserted before or after transverse cuts are made to form module-sized stacks. The pre-laminate stack assembly including a moisture barrier is then laminated in an operation 506, forming a seal around the entire perimeter of the moisture barrier, e.g., as shown above in FIG. 4. If still on a roll, the laminate stack may be cut as appropriate to define a module back sheet in an operation 508. The laminate stack may then be assembled with the solar cells, front layer and other module components to complete the module. One of skill in the art will understand that the order of various cutting, laminating and module assembly operations may vary. Also, another type of bonding (welding, fusing, etc.) may be performed form the seal surrounding the moisture barrier.

Figure 6:
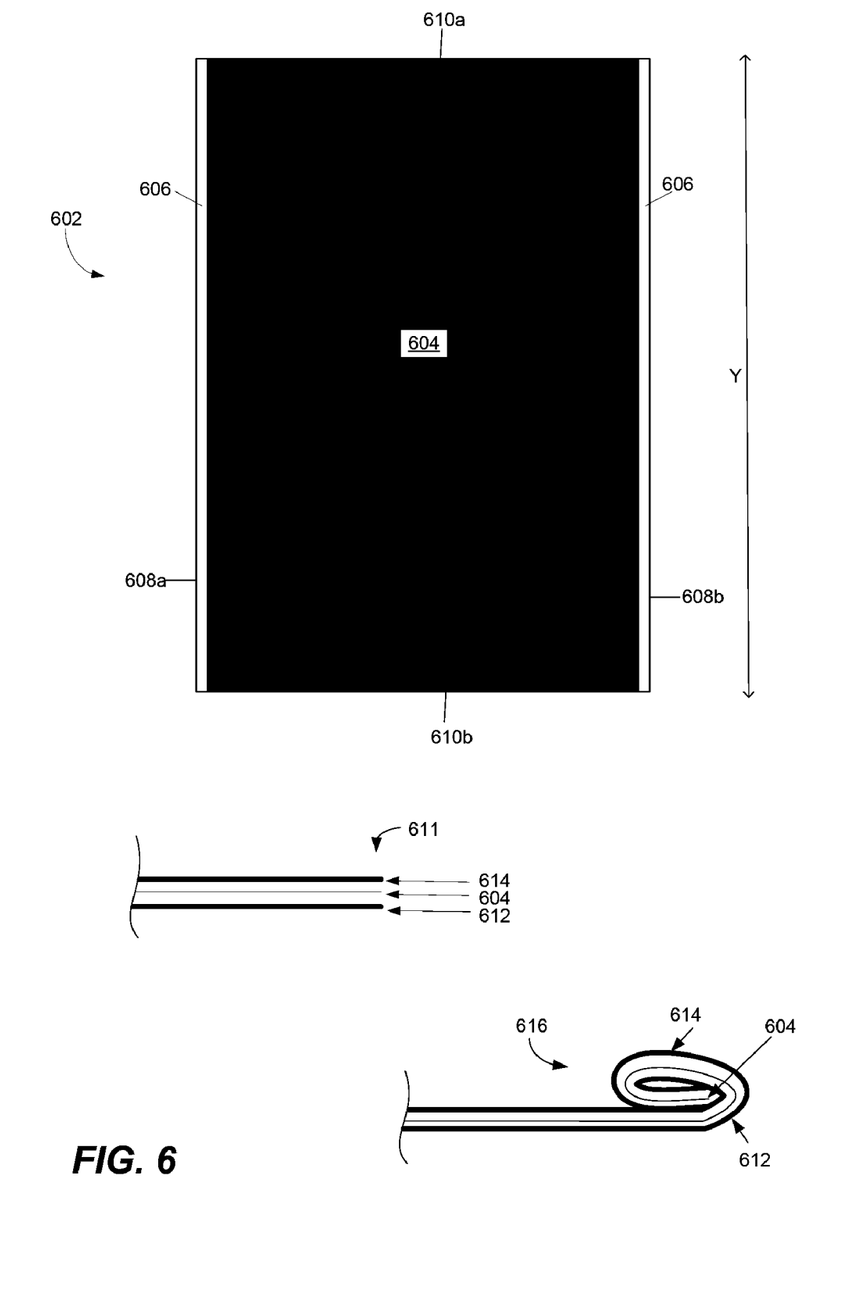
FIG. 6 depicts various views of a cut laminate stack including a moisture barrier and overlying and underlying polymer layers according to certain embodiments.

In process 550, rather than inserting discrete sheets, the aluminum or other moisture barrier material is also provided as a web. The process begins in an operation 552 in which the polymer insulation sheet, adhesives (is used), backing layer and moisture barrier are provided on webs to form a pre-laminate stack assembly, e.g., insulation sheet/adhesive/moisture barrier/adhesive/back layer. In certain embodiments, the width of the moisture barrier web is less than the other webs to allow for formation of a seal. The pre-laminate stack assembly is laminated in an operation 554. The laminate stack is cut in an operation 556 to form module-sized laminate stacks. In certain embodiments, the resulting module-sized stack includes a moisture barrier material extending to the cut edges. This is depicted in FIG. 6, which shows a top view of laminate stack 602, including moisture barrier 604, uncut edges 608a and 608b, cut edges 610a and 610b, and a seal 606 along opposing uncut edges 608a and 608b of the laminate stack. Seal 606 includes bonded-together insulation sheet and backing layer polymeric layers. The moisture barrier 604 and the overlying and underlying polymer layers are coextensive along the length of module-sized stack (direction "Y" in the figure). A side view of a cut edge 611 is shown, with polymer layers 612 and 614 and moisture barrier 604. (Adhesive layers are not depicted for the sake of illustration.). Returning to FIG. 5, to electrically isolate the moisture barrier, the cut edges are folded in an operation 558. An example of such as fold is depicted at 616 in FIG. 6, with polymer layers 612 and 614 and moisture barrier 604 curved inward together, such that the edge of moisture barrier 604 is fully isolated by one or more of layers 612 and 614. An additional sealing operation may then be performed, e.g., by applying heat, pressure and or adhesive to the fold. The fold may include one or more inward curved portions, including bent or angled portions. In the example shown in FIG. 6, the edge is folded twice to form two inward curved portions, fully isolating the edge of the moisture barrier along the cut sides. The fold may be considered part of the seal that extends around the solar module.

Other Embodiments

According to various embodiments, the flexible back sheet may include one or more additional layers. For example, in certain embodiments, additional layers may be between the moisture barrier layer and a weatherable material and/or between the moisture barrier layer and an insulation layer. The seal may include a bond between any of the layers, so long as a layer overlying the moisture barrier is bonded to an underlying barrier such to prevent any electrical connection to the edge of the moisture barrier.

While the description above refers chiefly to metallic moisture barriers, other types of flexible moisture barriers are within the scope of the invention, including moisture barriers made of non-metallic conductive materials, semiconductor materials, etc. As described above, in certain embodiments, the back sheets and methods described herein find particular application with conductive moisture barriers.

In addition to the specific examples of polymeric materials that may be used for the insulation sheet, back layer, adhesives, etc., examples of materials that may be used as appropriate for one of these layers or for other layers in the module include, silicone, silicone gel, epoxy, RTV silicone rubber, polydimethyl siloxane (PDMS), polyvinyl butyral (PVB), polycarbonates, acrylics, urethanes including thermoplastic polyurethanes (TPU), poly(vinyl acetal), polyolefin block elastomers, ethylene acrylate ester copolymers, acid copolymers, silicone elastomers, epoxy resins, polyolefin block elastomers, ethylene acrylate ester copolymers, rubber, thermoplastic elastomers, other materials with similar material properties, and mixtures thereof.

Although the foregoing invention has been described in some detail for purposes of clarity of understanding, it will be apparent that certain changes and modifications may be practiced within the scope of the invention. It should be noted that there are many alternative ways of implementing both the processes and apparatuses of the present invention. Accordingly, the present embodiments are to be considered as illustrative and not restrictive, and the invention is not to be limited to the details given herein.

What is claimed is:

1. A photovoltaic module comprising:
a transparent front layer;
a multi-layer flexible back sheet; and
a plurality of interconnected photovoltaic cells disposed between the transparent front layer and the multi-layer flexible back sheet, wherein said multi-layer flexible back sheet comprises an insulation sheet, an electrically isolated moisture barrier, a back layer and a seal;
said insulation sheet disposed between the plurality of photovoltaic cells and the moisture barrier, said moisture barrier disposed between the insulation sheet and the back layer, and further wherein said seal comprises a bond between a peripheral region of each of the insulation sheet and the back layer, said seal directly contacts the peripheral region of each of the insulation sheet and the back layer, and the moisture barrier is recessed from the peripheral regions such that the seal extends around the moisture barrier, and the moisture barrier is electrically isolated by the insulation sheet, back layer and seal.

2. The photovoltaic module of claim 1 wherein the moisture barrier comprises a thin metal sheet.

3. The photovoltaic module of claim 1 wherein the moisture barrier comprises a pinhole free aluminum foil sheet.

4. The photovoltaic module of claim 1 wherein moisture barrier has thickness of no more than about 50 microns.

5. The photovoltaic module of claim 1 wherein the moisture barrier has a thickness of no more than about 25 microns.

6. The photovoltaic module of claim 1 wherein the insulation sheet withstands at least a 600 V potential.

7. The photovoltaic module of claim 1 wherein the insulation sheet withstands at least a 1000 V potential.

8. The photovoltaic module of claim 1 wherein the insulation sheet is selected from at least one of the group consisting of polyethylene terephthalate (PET), nylons, acylonitrile butadiene styrene ABS), polybutylene terephtalate (PBT), (polycarbonate (PC), PPS (polyphenylene sulfide (PPS), and polyphenylene oxide (PPO).

9. The photovoltaic module of claim 1 wherein the back layer comprises a fluorinated polymer.

10. The photovoltaic module of claim 1 wherein the bond comprises a polymer adhesive bonding.

11. The photovoltaic module of claim 1 wherein the insulation sheet and the moisture barrier have substantially coextensive end portions along a first direction.

12. The photovoltaic module of claim 11 wherein a coextensive insulation sheet end portion and a moisture barrier end portion together form an inwardly curved end portion, with said moisture barrier end portion on the interior of said inwardly curved end portion.

13. The photovoltaic module of claim 1 wherein the seal extends at least about 1 mm past at least two edges of the moisture barrier.

14. The photovoltaic module of claim 12 comprising an edge seal material surrounding the plurality of photovoltaic cells, wherein said edge seal material has an outer perimeter larger than that of the flexible back sheet.

15. The photovoltaic module of claim 1 wherein the wherein the multi-layer flexible back sheet is ungrounded and has a water vapor transmission rate (WVTR) of no more than about $10^{-2}$ g/m$^2$/day.

16. The photovoltaic module of claim 1 wherein the wherein the multi-layer flexible back sheet is ungrounded and has a water vapor transmission rate (WVTR) of no more than about $10^{-3}$ g/m$^2$/day.

17. The photovoltaic module of claim 1 wherein the transparent front layer is rigid.

18. A photovoltaic module comprising:
   a transparent front layer;
   an ungrounded moisture barrier flexible back sheet; and
   a plurality of interconnected photovoltaic cells located between the transparent front layer and the ungrounded moisture barrier flexible back sheet, wherein the ungrounded moisture barrier flexible back sheet has a water vapor transmission rate (WVTR) of no more than about $10^{-2}$ g/m$^2$/day, and
   said moisture barrier flexible back sheet comprises an insulation sheet, an electrically isolated moisture barrier, a back layer and a seal; said insulation sheet disposed between the plurality of photovoltaic cells and the moisture barrier, said moisture barrier disposed between the insulation sheet and the back layer, and further wherein said seal comprises a bond between a peripheral region of each of the insulation sheet and the back layer, said seal directly contacts each of the insulation sheet and the back layer, and the moisture barrier is recessed from the peripheral regions such that the seal extends around the moisture barrier.

19. The photovoltaic module of claim 18 wherein the ungrounded electrically isolated flexible back layer has a water vapor transmission rate (WVTR) of no more than about $10^{-3}$ g/m$^2$/day.

20. The photovoltaic module of claim 18 wherein the photovoltaic module is configured from frameless installation in a system to provide electricity, wherein the moisture barrier flexible backsheet is ungrounded when so installed.

\* \* \* \* \*

UNITED STATES PATENT AND TRADEMARK OFFICE
CERTIFICATE OF CORRECTION

| | | |
|---|---|---|
| PATENT NO. | : 7,829,783 B2 | Page 1 of 1 |
| APPLICATION NO. | : 12/464721 | |
| DATED | : November 9, 2010 | |
| INVENTOR(S) | : Krajewski et al. | |

It is certified that error appears in the above-identified patent and that said Letters Patent is hereby corrected as shown below:

In line 10 of claim 18 (column 10, line 4) "harrier" should read --barrier--.

Signed and Sealed this
Eighteenth Day of October, 2011

David J. Kappos
*Director of the United States Patent and Trademark Office*